United States Patent [19]
Flamm

[11] Patent Number: 4,547,763
[45] Date of Patent: * Oct. 15, 1985

[54] MOS PARALLEL A/D CONVERTER

[75] Inventor: Peter M. Flamm, Freiburg, Fed. Rep. of Germany

[73] Assignee: ITT Industries, Inc., New York, N.Y.

[*] Notice: The portion of the term of this patent subsequent to Aug. 23, 2000 has been disclaimed.

[21] Appl. No.: 503,229

[22] Filed: Jun. 10, 1983

Related U.S. Application Data

[63] Continuation of Ser. No. 326,637, Dec. 2, 1981, Pat. No. 4,400,693.

[30] Foreign Application Priority Data

Dec. 11, 1980 [EP] European Pat. Off. ........ 80107811.4

[51] Int. Cl.⁴ ............................................. H03K 13/175
[52] U.S. Cl. ........................ 340/347 CC; 340/347 AD; 358/13
[58] Field of Search ................. 340/347 AD, 347 CC; 358/13

[56] References Cited

U.S. PATENT DOCUMENTS

| | | | |
|---|---|---|---|
| 3,747,089 | 7/1973 | Sharples | 340/347 AD |
| 3,982,241 | 9/1976 | Lipcon | 340/347 AD |
| 4,110,745 | 8/1978 | Ninomiya | 340/347 AD |
| 4,400,693 | 8/1983 | Flamm | 340/347 AD |

OTHER PUBLICATIONS

Dingwall "IEEE Journal of Solid-State Circuits" vol. SC-14, No. 6, Dec. 1979, pp. 926-932.

Primary Examiner—Charles D. Miller
Attorney, Agent, or Firm—Donald J. Lenkszus

[57] ABSTRACT

For the dynamic compensation of the offset voltage in such converters each non-inverting comparator input (+) is connected via a first transfer transistor (T11, T12, T1p) to the signal input (SE) and via a second transfer transistor (T21, T22, T2p) to the associated voltage divider tap of the voltage divider as applied to the reference voltage (Ur). Moreover, each inverting comparator input (−), via a capacitor (C1, C2, Cp) is applied to the associated voltage divider tap and, via a third transfer transistor (T31, T32, T3p) and across a resistor (R'1, R'2, R'p) arranged in series therewith, to the associated comparator output. The second and third transfer transistors are rendered conductive during short intervals (T) between conversions by the clock signal (F), and the first transfer transistors are rendered non-conductive via the inverter (IV), and during the conversion time (t) the first transfer transistors are rendered conductive, and the second and third transfer transistors are rendered non-conductive. In television receivers, such MOS parallel A/D converters are suitable for processing the video signal, in which case the line sweep period serves as the conversion time (t), and the line fly-back period serves as the interval (T) between conversions.

24 Claims, 1 Drawing Figure

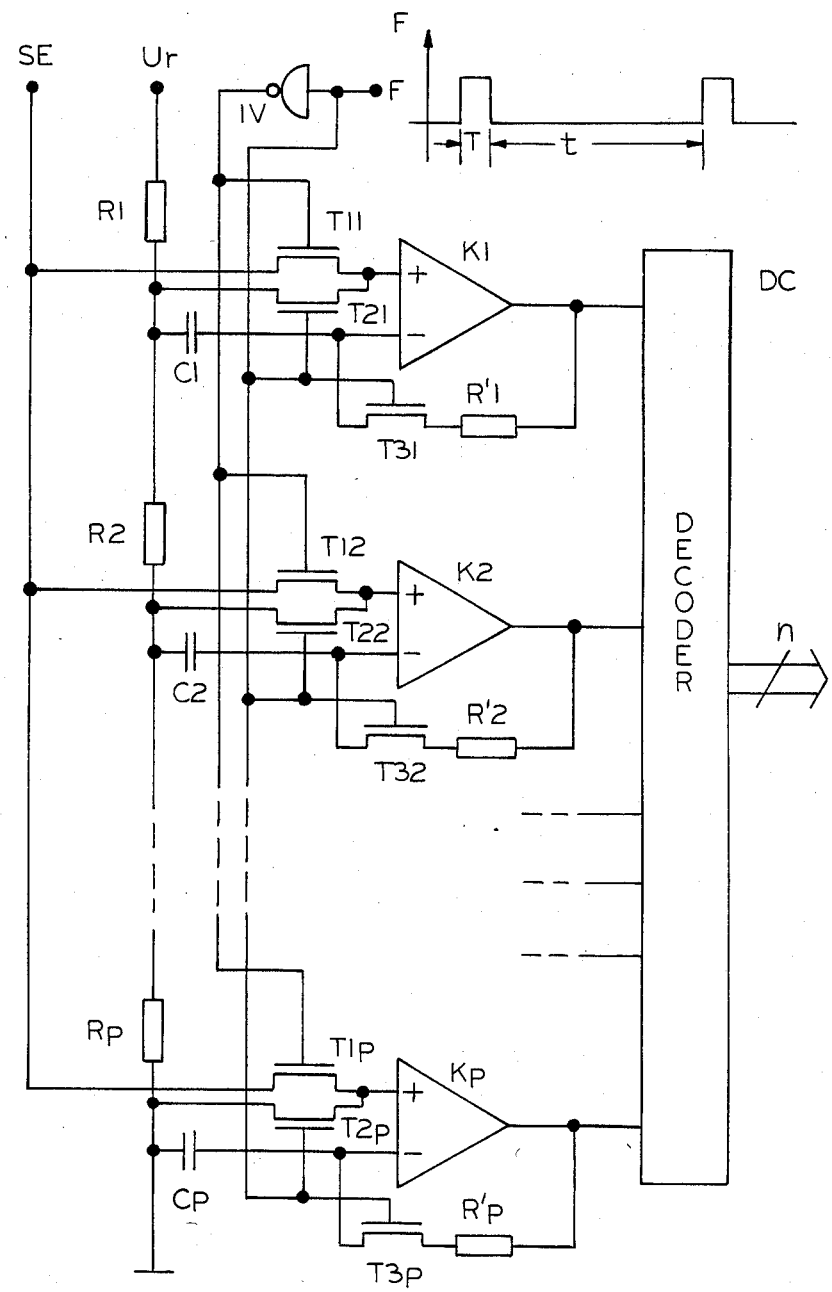

MOS PARALLEL A/D CONVERTER

This is a continuation of application Ser. No. 326,637, filed Dec. 2, 1981, now U.S. Pat. No. 4,400,693.

The invention relates to monolithic integrated parallel analog-to-digital converters employing insulated-gate field-effect transistors, briefly referred to as MOS parallel A/D converters.

According to the book by D. F. Hoeschele "Analog-to-Digital/Digital-to-Analog-Conversion Techniques", New York, 1968, pp. 10, 249, 253 to 259 and 409 to 412, such MOS parallel A/D converters consist of $p=2^n-1$ comparators, of a voltage divider consisting of p or $p-1$ resistors and applied to a reference voltage, and of a decoder part connected to the outputs of the comparators. Relative thereto, n indicates the number of binary positions of the digital converter output signal. All comparator inputs of the one kind, hence the non-inverting inputs are connected to the signal input, and the comparator inputs of the other kind, hence for example, the inverting inputs, are each connected to one tapping point of the voltage divider.

In realizing such MOS parallel analog-to-digital converters the offset voltage differences of the individual comparators are noticed disadvantageously, which must be substantially smaller than the voltage element belonging to the least significant bit which, as a rule, is equal to the voltage drop across one of the voltage-dividing resistors. For the purpose of numerically illustrating this problem it be assumed that a 7-bit converter which, accordingly, includes 127 comparators, and the voltage divider thereof are being operated from a 5 V reference voltage, so that the aforementioned voltage element amounts to about 40 mV. In that case, the differences of the offset voltages may amount in the utmost to about ±2.5 mV. Such small offset voltage differences, however, if at all, are only very difficult to realize.

This is intended to be remedied by the invention. The invention, as characterized in the claims, solves the problem of designing the MOS parallel A/D converters, from a circuit-technical point of view, in such a way that by it the offset voltage differences are compensated dynamically.

The advantages obtained by the invention compulsorily result from the solution to the problem so that it is now possible to realize fast MOS parallel A/D converters of high resolving power. In particular, it becomes possible to provide MOS parallel A/D converters for processing the video signals occurring in television receivers, so that the invention can be preferably used in connection with such types of television receivers.

The invention will now be described in greater detail with reference to the accompanying drawing showing a schematic circuit diagram relating to a preferred example of embodiment in the form of a block diagram. According to the number n of the binary positions of the converter output signal which is capable of being taken off the output of the decoder part DC, there are provided $p=2^n-1$ comparators K1, K2, Kp which, for example, may also consist of operational amplifiers, differential amplifiers or Schmitt triggers, with the outputs thereof being connected to the parallel input of the decoder part DC.

Each non-inverting input + of the comparators K1 . . . Kp is applied via the controlled current path of the first transfer transistor T11, T12, T1p, to the signal input SE. Moreover, the non-inverting input, via the controlled current path of the second transfer transistor T21, T22, T2p, is applied to the associated voltage-divider tapping point. This voltage-divider consists of the voltage-dividing resistors R1, R2, Rp and is applied to the reference voltage Ur. Accordingly, in the drawing the second transistor T21 is shown to be applied to the point connecting the resistors R1, R2, the second transistor T22 is shown to be applied to the point connecting the resistor R2 to the next voltage-dividing resistor (not shown in the drawing), and the second transistor T2p is shown to be applied to the point connecting the last resistor Rp of the voltage divider to the zero point of the circuit.

To each of the just mentioned voltage-divider taps there is also applied one each of the capacitances C1, C2, Cp, with the respective other terminals thereof being applied to the inverting input of the associated comparator K1, K2, Kp. As such capacitances there are advantageously used MOS capacitors which are then included in the integrated circuit. It is also possible, however, to realize these capacitances with the aid of other capacitors or else with the aid of capacitors to be connected to the integrated circuit from the outside.

From the output of each comparator K1, K2, Kp a feedback loop extends to the associated inverting input consisting of the resistor R'1, R'2, R'p and of the controlled current path of the respective third transfer transistor T31, T32, T3p arranged in series therewith. The one end of the controlled current path of the respective third transfer transistor, accordingly, is also applied to the one terminal of the corresponding capacitor C1, C2, Cp.

The gates of the second and third transfer transistors T21, T31; T22, T32; T2p, T3p as associated with the respective comparator K1, K2, Kp are connected with each other and are applied to a clock signal F switching them to the conducting state only during a short interval T between conversions, with the curve of this clock signal F, as a function of time, being schematically denoted in the right hand upper part of the drawing and which, by being inverted via the inverter IV, also controls the gates of the first transfer transistors T11, T12, T1p. The short intervals T between conversions may also be referred to as compensating times, because dynamic compensation is effective during these intervals.

Accordingly, during the intervals T between conversions, the second and the third transfer transistors are rendered conductive while the first transfer transistors are rendered non-conductive, with it being supposed with respect to the example of embodiment shown in the drawing, that the transistors as used therein, are p-channel transistors of the enhancement type. Accordingly, across the respective resistor R'1, R'2, R'p the voltage at the respective inverting input of the comparators K1, K2, Kp is adjusted to the voltage value at the associated voltage-divider tap inclusive of the respective offset voltage of the comparators, because the second transfer transistors, the non-inverting input is applied to this potential point which otherwise, however, is applied to the signal input SE. In this way, the respective capacitor C1, C2, Cp is charged to the offset voltage of the associated comparator.

During the conversion times t, hence during the times of analog-to-digital conversion, the second and the third transfer transistors are non-conductive and the first transfer transistors are conductive, so that the input signal is switched to the non-inverting input, and the inverting input is retained at the potential of the voltage-divider tap inclusive of the respective offset voltage, so that the capacitors C1 ... Cp, during the conversion times t, form a source of compensating voltage for the associated comparators K1 ... Kp.

A rough estimate of the preferred use in connection with television receivers, by employing the aforementioned numerical values, and in the case of a 7-bit parallel A/D converter, based on a conversion time of $t \approx 60$ $\mu$s and on a voltage variation admitted during this time, at the respective capacitance of $dU \approx 0.25$ mV, which corresponds approximately to 10% of the portion of the reference voltage associated with the least significant bit, as well as on a leakage current sum of the respective comparator input transistor and of the third transfer transistor $I_L \approx 10$ pA, results in the following capacitance value:

$$C = \frac{t}{dU} I_L \approx 2.5 \text{ pF}.$$

Capacitances in this order of magnitude can be realized without further ado by employing the MOS technique, as so-called MOS capacitors having a reasonable surface space requirement.

I claim:

1. A monolithic integrated analog-to-digital converter comprising:
a terminal coupleable to a source of analog signals;
a plurality of reference signal points;
a plurality of comparator stages, each stage comprising: a comparator having a first input of a first type, a second input of a second type, and an output; a first transfer transistor having two conductive states and having its controlled current path connected between said terminal and said first input; a second transfer transistor having two conductive states and having its controlled current path connected between said first input and one of said plurality of reference signal points; capacitive means coupled between said second input and said one of said plurality of reference signal points; and a feedback path coupling said output to said second input, said feedback path comprising a third transfer transistor having two conductive states and having its controlled current path serially connected in said feedback path;
a decoder having inputs coupled to said comparator stage outputs and having a digital output;
means for causing all of said first transistors to each assume a first one of said first transistor two conductive states during periodically recurring first predetermined time intervals while concurrently causing all of said second transistors to each assume a first one of said second transistor two conductive states and all of said third transistors to each assume a first one of said third transistor two conductive states;
means for causing all of said first transistors to each assume a second one of said first transistor two conductive states during periodically recurring second predetermined time intervals while concurrently causing all of said second transistors to assume a second one of said second transistor two conductive states and all of said third transistors to each assume a second one of said third transistor two conductive states.

2. An analog-to-digital converter in accordance with claim 1, wherein said first predetermined time interval is the conversion time period and said second predetermined time interval is a relatively short time period between two of said conversion time periods.

3. An analog-to-digital converter in accordance with claim 2, wherein in each comparator stage during said first predetermined time intervals:
said first transistor couples analog signals at said terminal to said first input;
said second transistor effectively decouples said first input and said one reference signal point; and
said third transistor effectively decouples said feedback path.

4. An analog-to-digital converter in accordance with claim 3, wherein in each comparator stage during said second predetermined time intervals:
said first transistor effectively decouples said terminal and said first input;
said second transistor couples said first input and said one reference signal point; and
said third transistor couples said output to said second input.

5. An analog-to-digital converter in accordance with claim 4, wherein during said first predetermined intervals conversion of analog signals to digital signals occurs, and during said second predetermined intervals the signal level at each said second terminal is adjusted by means of each corresponding said second transistor, said third transistor and said capacitor whereby each comparator stage is adjusted to compensate for the offset voltage of its comparator.

6. An analog-to-digital converter in accordance with claim 1 comprising:
a voltage divider having a second terminal adapted for coupling to a reference voltage and having a plurality of voltage taps, each of said taps being coupled to one of said reference signal points.

7. An analog-to-digital converter in accordance with claim 1, wherein each comparator stage includes a serially connected resistance in said feedback path.

8. An analog-to-digital converter in accordance with claim 1, wherein each said capacitive means comprises a MOS capacitor.

9. A monolithic integrated analog-to-digital converter for use in television receivers comprising:
a terminal coupleable to a source of analog signals;
a plurality of reference signal points;
a plurality of comparator stages, each stage comprising: a comparator having a first input of a first type, a second input of a second type, and an output; a first transfer transistor having two conductive states and having its controlled current path connected between said terminal and said first input; a second transfer transistor having two conductive states and having its controlled current path connected between said first input and one of said plurality of reference signal points; capacitive means coupled between said second input and said one of said plurality of reference signal points; and a feedback path coupling said output to said second input, said feedback path comprising a third transfer transistor having two conductive states and having its controlled current path serially connected in said feedback path;
a decoder having inputs coupled to said comparator stage outputs and having a digital output;
means for causing all of said first transistors to each assume a first one of said first transistor two conductive states during periodically recurring line sweep periods while concurrently causing all of said second transistors to each assume a first one of said second transistors, two conductive states and all of said third transistors to each assume a first one of said third transistor two conductive states;

means for causing all of said first transistors to each assume a second one of said first transistor two conductive states during periodically recurring line flyback periods while concurrently causing all of said second transistors to assume a second one of said second transistor two conductive states and all of said third transistors to each assume a second one of said third transistor two conductive states.

10. An analog-to-digital converter in accordance with claim 9, wherein in each comparator stage during said line sweep period:

said first transistor couples analog signals at said terminal to said first input;

said second transistor effectively decouples said first input and said one reference signal point; and said third transistor effectively decouples said feedback path.

11. An analog-to-digital converter in accordance with claim 10, wherein in each comparator stage during said line flyback periods, said first transistor effectively decouples said terminal and said first input;

said second transistor couples said first input and said one reference signal point; and said third transistor couples said output to said second input.

12. An alanog-to-digital converter in accordance with claim 11, wherein during said line sweep periods conversion of analog signals to digital signals occurs, and during said line flyback periods the signal level at each said second terminal is adjusted by means of each corresponding said second transistor, said third transistor and said capacitor whereby each comparator stage is adjusted to compensate for the offset voltage of its comparator.

13. An analog-to-digital converter in accordance with claim 9 comprising:

a voltage divider having a second terminal adapted for coupling to a reference voltage and having a plurality of voltage taps, each of said taps being coupled to one of said reference signal points.

14. An analog-to-digital converter in accordance with claim 9, wherein each comparator stage includes a serially connected resistance in said feedback path.

15. A monolithic integrated analog-to-digital converter comprising:

a first terminal coupleable to a source of analog signals;

a voltage divider coupled to a reference voltage and comprising a plurality of resistance elements and voltage taps;

a plurality of comparator stages each stage having a first input coupled to said first terminal, a second input coupled to one of said voltage taps, and an output; a decoder having inputs coupled to said plurality of comparator stage outputs and having a plurality of binary outputs; each said comparator stage comprising: a comparator having a first input of a first type, a second input of a second type, and an output; a first transfer transistor having its controlled current path coupled between said comparator stage first input and said comparator first input; a second transfer transistor having its controlled current path coupled between said comparator stage second input and said comparator first input; a capacitive element coupled between said second comparator stage input and said comparator second input; a third transfer transistor having its controlled current path coupled between said comparator output and said comparator second input;

means for causing all of said first transistors to become conductive during periodically recurring first time intervals while concurrently causing all of said second and third transistors to become relatively non-conductive during said first time intervals and for causing all of said first transistors to become relatively non-conductive during periodically recurring second time intervals while concurrently causing all of said second and third transistors to become conductive during said second time intervals.

16. A monolithic integrated analog-to-digital converter in accordance with claim 15, wherein said decoder has "n" bit outputs and the number of said plurality of output stages is $p = 2^n - 1$.

17. A monolithic integrated analog-to-digital converter in accordance with claim 15, wherein said means comprises first circuit connections connecting all of the gates of said first transistors to a common point and second circuit connections connecting all of the gates of said second and third transistors to a second common point, said first and second common points being coupled to a source of clock signals.

18. A monolithic integrated analog-to-digital converter in accordance with claim 17, wherein said means further comprises: first circuit means coupling said first common point to a clock terminal; and a second circuit means coupling said second common point to said clock terminal; one of said first or second circuit means comprising an inverter.

19. A monolithic integrated analog-to-digital converter in accordance with claim 17, wherein each of said comparator stages comprises a resistor serially connected with said third transistor controlled current path.

20. A monolithic integrated analog-to-digital converter for use in a television receiver comprising:

a first terminal coupleable to a source of analog signals;

a voltage divider coupled to a reference voltage and comprising a plurality of resistance elements and voltage taps;

a plurality of comparator stages each stage having a first input coupled to said first terminal, a second input coupled to one of said voltage taps, and an output; a decoder having inputs coupled to said plurality of comparator stage outputs and having a plurality of binary outputs; each said comparator stage comprising: a comparator having a first input of a first type, a second input of a second type, and an output; a first transfer transistor having its controlled current path coupled between said comparator stage first input and said comparator first input; a second transfer transistor having its controlled current path coupled between said comparator stage second input and said comparator first input; a capacitive element coupled between said second comparator stage input and said comparator second input; a third transfer transistor having its controlled current path coupled between said comparator output and said comparator second input;

means for causing all of said first transistors to become conductive during periodically recurring line sweep periods while concurrently causing all of said second and third transistors to become relatively non-conductive during said line sweep periods and for causing all of said first transistors to become relatively non-conductive during periodically recurring line flyback periods while concurrently causing all of said second and third transistors to become conductive during said line flyback periods.

21. A monolithic integrated analog-to-digital converter in accordance with claim 20, wherein said decoder has "n" bit outputs and the number of said plurality of output stages is $p = 2^n - 1$.

22. A monolithic integrated analog-to-digital converter in accordance with claim 20, wherein said means comprises first circuit connections connecting all of the gates of said first transistors to a common point and second circuit connections connecting all of the gates of said second and third transistors to a second common point, said first and second common points being coupled to a source of clock signals.

23. A monolithic integrated analog-to-digital converter in accordance with claim 22, wherein said means further comprises: first circuit means coupling said first common point to a clock terminal; and a second circuit means coupling said second common point to said clock terminal; one of said first or second circuit means comprising an inverter.

24. A monolithic integrated analog-to-digital converter in accordance with claim 22, wherein each of said comparator stages comprises a resistor serially connected with said third transistor controlled current path.

* * * * *